(12) United States Patent
Matsumoto et al.

(10) Patent No.: US 10,676,050 B2
(45) Date of Patent: Jun. 9, 2020

(54) SENSOR DEVICE

(71) Applicant: Hitachi Automotive Systems, Ltd., Hitachinaka-shi, Ibaraki (JP)

(72) Inventors: Masahiro Matsumoto, Tokyo (JP); Hiroshi Nakano, Tokyo (JP); Yoshimitsu Yanagawa, Tokyo (JP)

(73) Assignee: HITACHI AUTOMOTIVE SYSTEMS, LTD., Hitachinaka-Shi (JP)

( * ) Notice: Subject to any disclaimer, the term of this patent is extended or adjusted under 35 U.S.C. 154(b) by 0 days.

(21) Appl. No.: 15/753,719

(22) PCT Filed: Jul. 27, 2016

(86) PCT No.: PCT/JP2016/071947
§ 371 (c)(1),
(2) Date: Feb. 20, 2018

(87) PCT Pub. No.: WO2017/038314
PCT Pub. Date: Mar. 9, 2017

(65) Prior Publication Data
US 2018/0354435 A1    Dec. 13, 2018

(30) Foreign Application Priority Data

Sep. 4, 2015 (JP) .................... 2015-174304

(51) Int. Cl.
*B60L 1/00* (2006.01)
*B60L 3/00* (2019.01)
(Continued)

(52) U.S. Cl.
CPC .............. *B60R 16/03* (2013.01); *G01D 3/08* (2013.01); *G01D 5/12* (2013.01); *G01D 21/00* (2013.01);
(Continued)

(58) Field of Classification Search
CPC .......... B60R 16/03; G05F 1/465; G05F 1/10; G01D 21/00; G01D 3/08; G01D 5/12;
(Continued)

(56) References Cited

U.S. PATENT DOCUMENTS 4,088,943 A    5/1978  Schmidt
5,085,526 A    2/1992  Sawtell et al.
(Continued)

FOREIGN PATENT DOCUMENTS

JP    S53-106179 A    9/1978
JP    H04-328905 A    11/1992
(Continued)

OTHER PUBLICATIONS

International Search Report with its English translation and Written Opinion issued in corresponding application No. PCT/JP2016/071947 dated Nov. 15, 2016.
(Continued)

*Primary Examiner* — Rexford N Barnie
*Assistant Examiner* — Rasem Mourad
(74) *Attorney, Agent, or Firm* — Foley & Lardner LLP

(57) ABSTRACT

In a sensor device 1 according to the present invention, power is supplied from a control device 10 to a power supply terminal 7 and a ground terminal 9 of the sensor device 1 via a power supply line Vcc and a ground line Gnd, respectively, and a sensor output voltage is sent from a sensor output terminal 8 to the control device 10 via a sensor output line Vout. The control device 10 has disposed therein a constant voltage source 11 that supplies a constant voltage to the sensor device 1, and a pull-up resistor 12 connected between the sensor output line Vout and the constant voltage source 11. The sensor device 1 comprises: a physical quantity detection unit 2 that varies a voltage Vsen in accordance with a measured physical quantity; a regulator 3 that gen-
(Continued)

erates a low voltage from a power supply voltage supplied from the power supply terminal 7; an open-collector operational amplifier 4 that operates with the low voltage supplied from the regulator 3 to control a voltage for the sensor output terminal 8; and resistor elements 5, 6 that together form a voltage divider circuit for subjecting the voltage for the sensor output terminal 8 to voltage division.

12 Claims, 6 Drawing Sheets

(51) Int. Cl.
| | |
|---|---|
| *H02G 3/00* | (2006.01) |
| *B60R 16/03* | (2006.01) |
| *G01L 9/00* | (2006.01) |
| *H03K 17/30* | (2006.01) |
| *G05F 1/46* | (2006.01) |
| *G01D 21/00* | (2006.01) |
| *G01D 5/12* | (2006.01) |
| *G01D 3/08* | (2006.01) |
| *G01R 19/165* | (2006.01) |
| *G01R 31/28* | (2006.01) |
| *G05F 1/10* | (2006.01) |
| *G01D 5/16* | (2006.01) |

(52) U.S. Cl.
CPC .............. *G01L 9/00* (2013.01); *G01R 19/165* (2013.01); *G01R 31/2829* (2013.01); *G05F 1/10* (2013.01); *G05F 1/465* (2013.01); *H03K 17/30* (2013.01); *G01D 5/16* (2013.01)

(58) Field of Classification Search
CPC .... G01D 5/16; G01R 19/165; G01R 31/2829; H03K 17/30; G01L 9/00
See application file for complete search history.

(56) References Cited

U.S. PATENT DOCUMENTS

| | | | | |
|---|---|---|---|---|
| 5,461,262 | A * | 10/1995 | Hirasawa | ................ B60R 16/04 307/10.1 |
| 6,246,287 | B1 * | 6/2001 | Yamashita | .............. G01P 15/09 330/174 |
| 2004/0189480 | A1 * | 9/2004 | Imai | ........................ B60T 17/22 340/663 |
| 2006/0220730 | A1 | 10/2006 | Lobb et al. | |
| 2009/0188120 | A1 * | 7/2009 | Steinich | ................... G01D 3/08 33/1 PT |
| 2013/0334876 | A1 * | 12/2013 | Yamaguchi | ............... G05F 1/10 307/9.1 |
| 2014/0009455 | A1 * | 1/2014 | Li | ........................ G09G 3/3406 345/212 |
| 2015/0236648 | A1 * | 8/2015 | Ahmad | ................. H03F 1/3211 330/84 |
| 2015/0260765 | A1 | 9/2015 | Matsumoto et al. | |
| 2016/0233840 | A1 * | 8/2016 | Wang | .................... H03H 7/075 |
| 2017/0045403 | A1 * | 2/2017 | Zanbaghi | ................. G01K 7/01 |

FOREIGN PATENT DOCUMENTS

| | | |
|---|---|---|
| JP | 2009-200667 A | 9/2009 |
| JP | 2012-168080 A | 9/2012 |
| JP | 2014-025731 A | 2/2014 |

OTHER PUBLICATIONS

Extended European Search Report issued in corresponding European Patent Application No. 16841346.6, dated Apr. 1, 2019.

* cited by examiner

SENSOR DEVICE

TECHNICAL FIELD

The present invention relates to an in-vehicle sensor device.

BACKGROUND ART

As an example of an in-vehicle sensor device, there is a sensor device disclosed in PTL 1.

According to PTL 1, a sensor device is driven by receiving power supply from an external control device, and the sensor device outputs, to the control device, a physical quantity of a fluid flowing in an intake pipe, such as a flow rate, as an analog voltage. A voltage amplitude range of this analog voltage is needed to be from substantially 0 V to a power voltage supplied from the control device. Additionally, often used is a voltage 5 V or 12 V as the power voltage supplied from the control device.

CITATION LIST

Patent Literature

PTL 1: JP 2014-25731 A

SUMMARY OF INVENTION

Technical Problem

A sensor device disclosed in PTL 1 uses power from a control device without any change as power for a signal processing circuit of the sensor device. In recent years, a signal processing circuit provides higher performance by application of a microfabrication process. In a case of applying such a processing circuit, reduction of a drive voltage is demanded in order to prevent heat generation in the circuit, or the like. However, in an in-vehicle sensor device, a signal output value to a control device is needed to be output within a range up to a voltage supplied from the control device. In PTL 1, there still is room to examine such output within the range demanded as the sensor device while achieving a microfabrication process of the processing circuit.

The present invention is made in view of the above-described situation and directed to providing a sensor device in which a voltage of a signal processing circuit can be lowered.

Solution to Problem

To solve the above problem, a sensor device of the present invention includes a physical quantity detection unit, an output terminal, and an operational amplifier adapted to receive a detection signal of the physical quantity detection unit and output an output signal to the output terminal, in which the operational amplifier is driven with a voltage lower than the supplied voltage, and a negative organization signal having a voltage lower than the output signal is received.

Advantageous Effects of Invention

According to the present invention, it is possible to provide a sensor device in which output amplitude can be obtained up to a power voltage by using a signal processing circuit that is operated with a low voltage equal to or lower than the power voltage of the sensor device.

DESCRIPTION OF EMBODIMENTS

In the following, an embodiment of the present invention will be described with reference to the drawings.

Figure 1:
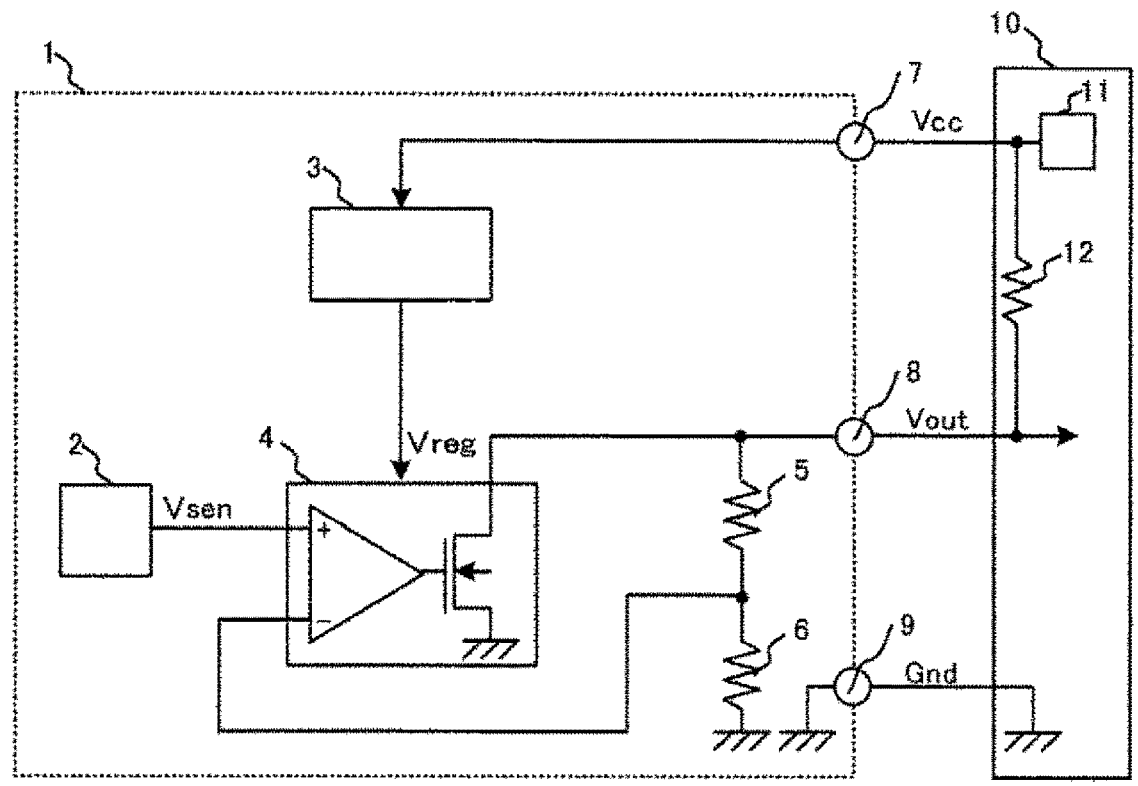
FIG. 1 is a diagram illustrating a circuit configuration of a sensor device according to a first practical example.
Figure 2:
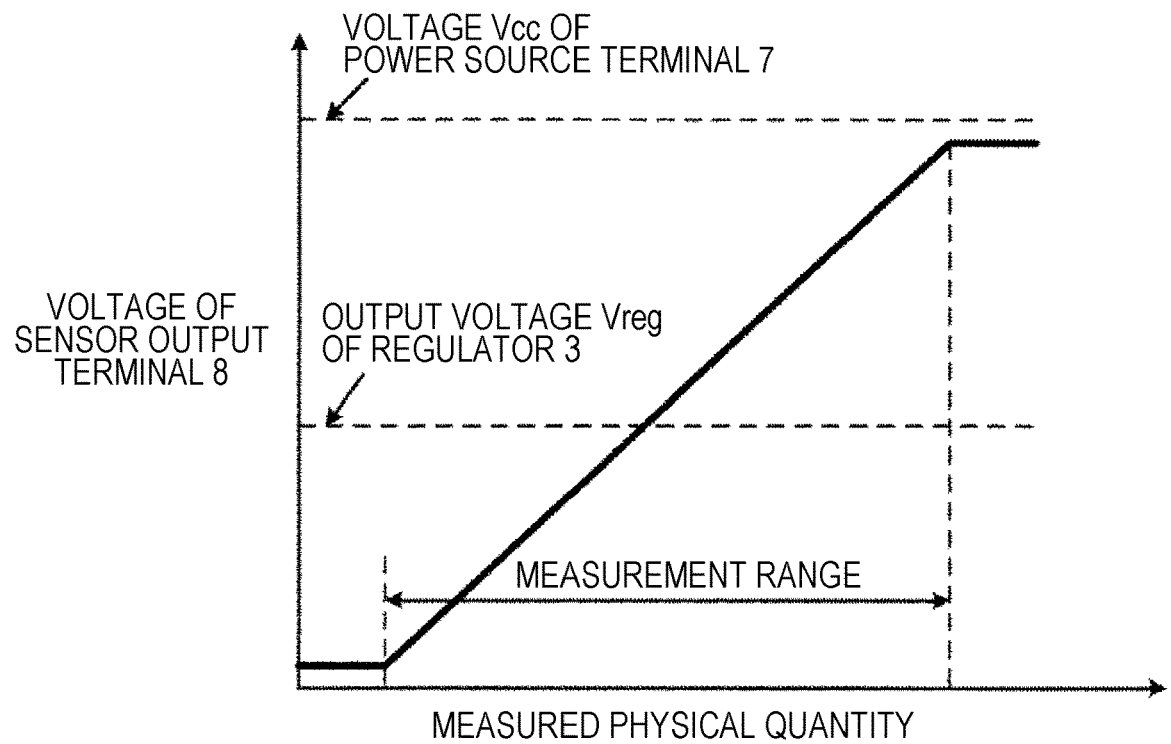
FIG. 2 is a graph illustrating a relation between a measured physical quantity and an output voltage Vout of a sensor device 1.

First, a sensor device according to a first practical example of the present invention will be described with reference to FIGS. 1 and 2.

A sensor device 1 of the present practical example is connected to a control device 10 via a power source line Vcc, a ground line Gnd, and a sensor output line Vout. The sensor device 1 has a power source terminal 7 connected to the power source line Vcc, a ground terminal 9 connected to the ground line Gnd, and a sensor output terminal 8 connected to the sensor output line Vout. The sensor device 1 is driven by power supplied from the control device 10 via the power source line Vcc and the ground line Gnd. Then, the sensor device 1 sends a sensor output voltage to the control device 10 from the sensor output terminal 8 via the sensor output line Vout. The control device 10 has: a constant voltage source 11 that supplies a constant voltage to the sensor device 1; and a pull-up resistor 12 connected between the sensor output line Vout and the constant voltage source 11. The sensor device 1 includes: a physical quantity detection unit 2 in which a voltage Vsen is changed in accordance with a measured physical quantity, a regulator 3 in which a power voltage supplied via the power source terminal 7 is received and a voltage lower than the power voltage is generated; an open collector type operational amplifier 4 that is operated with the low voltage supplied from the regulator 3 and controls a voltage of the sensor output terminal 8; and resistance elements 5 and 6 constituting a voltage divider that divides the voltage of the sensor output terminal 8. Note that a pressure sensor, an acceleration sensor, an angular velocity sensor, an air flow rate sensor, or the like is used as the physical quantity detection unit 2.

Next, an output signal of the sensor device 1 and an output voltage of the regulator 3 will be described by using FIG. 2. The sensor device 1 changes a voltage, namely, an output signal output from the sensor output terminal 8 in accordance with a measured physical quantity measured by the physical quantity detection unit 2. Here, an output range of the sensor device 1 is a requested measurement range of a measured physical quantity and is needed to be changed from substantially 0 V to a voltage Vcc of the power source terminal 7. Additionally, an output voltage Vreg supplied from the regulator 3 to the operational amplifier 4 is a voltage lower than a maximum voltage of the sensor output terminal 8. Therefore, the operational amplifier 4 is driven with the voltage Vreg that is lower than the maximum voltage of the sensor output terminal 8.

Next, operation of the sensor device 1 of the present practical example will be described. The physical quantity detection unit 2 outputs an analog voltage Vsen in a range from 0 V to Vreg (output voltage of the regulator 3) in accordance with the measured physical quantity. This analog voltage Vsen is connected to a non-inversion input of the operational amplifier 4. The operational amplifier 4 controls an output MOS transistor to control the voltage of the sensor output terminal 8. The sensor output line Vout connected to the sensor output terminal 8 is connected to the power source line Vcc via the pull-up resistor 12. Therefore, the output voltage of the sensor output terminal 8 can be changed from 0 V to the voltage Vcc of the power source terminal 7 by changing ON resistance of the output MOS transistor of the operational amplifier 4. A resistance circuit formed of the resistors 5 and 6 is provided between the sensor output terminal 8 and an inversion input of the operational amplifier 4. The voltage of the sensor output terminal 8 divided by the resistance elements 5 and 6 is received in the inversion input of the operational amplifier 4, and negative feedback is applied to the operational amplifier 4. As a result, the output analog voltage Vsen of the physical quantity detection unit 2 is amplified with an amplification factor corresponding to a voltage division ratio determined by the resistance elements 5 and 6, and is output with a characteristic illustrated in FIG. 2. At this point, the voltage Vreg that is a low voltage is supplied as power for the operational amplifier 4 as illustrated in FIG. 2. Therefore, in the present practical example, an in-phase input range of the operational amplifier 4 is made lower than the voltage Vreg, and the negative feedback voltage determined by the resistance elements 5 and 6 is determined so as to fall within the in-phase input range of the operational amplifier 4. In other words, even in a case where the voltage Vout of the sensor output terminal 8 is changed from 0 V to the voltage Vcc, the negative feedback voltage generated by voltage division in the resistance circuit is made to fall within the in-phase input range of the operational amplifier 4. As a result, in the sensor device 1 of the present practical example, the voltage of the sensor output terminal 8 can be changed from 0 V to the voltage Vcc of the power source terminal 7 even in a case of using the operational amplifier 4 operated with the low-voltage power supplied from the regulator 3.

Next, effects of the present practical example will be described. First of all, a first effect is that a drive voltage of the operational amplifier 4 can be lowered. As a result, the operational amplifier 4 can be manufactured by a microfabrication process and can be miniaturized into a chip size. Additionally, since the high-performance MOS transistor can be used by application of the microfabrication process, the operational amplifier 4 can achieve higher performance. Furthermore, since the operational amplifier 4 can be manufactured by the microfabrication process, a large-scale logic circuit can be arranged on a same semiconductor chip as the operational amplifier 4. Therefore, the sensor device 1 can have complicated functions while being formed in a small area. Next, a second effect is that an input circuit of the operational amplifier 4 having degraded noise immunity due to application of the microfabrication process can be easily protected. The sensor output terminal 8 is connected to the control device 10 via the sensor output line Vout, but the output line Vout is laid over a long distance, and external noise is applied to the output line Vout from a noise source existing around the output line Vout. Therefore, in a case where no countermeasure is taken in a state where the noise immunity is degraded due to application of the microfabrication process, a noise voltage is applied to the sensor output terminal 8 via the power source line, and the sensor device 1 may be destroyed. However, the sensor device 1 of the present practical example reduces such a noise voltage by the voltage divider (resistance circuit) formed of the resistance elements 5 and 6. Therefore, in the present practical example, there are effects in that noise current is reduced by resistance itself of the resistance element 5 and also the noise voltage is reduced by a time constant generated by resistance of the resistance element 5 and a parasitic capacitance existing in the resistance element 5. With the effects, the input circuit of the operational amplifier 4 having the degraded noise immunity due to application of the microfabrication process can be easily protected. Meanwhile, resistance values of the resistance elements 5 and 6 are preferably high, more preferably, 10 kΩ or more. Additionally, one end of the resistance element 6 is preferably connected to the ground in order to increase the effect of reducing the noise voltage by voltage division performed by the resistance elements 5 and 6.

In the present practical example, the open collector type has been described as the operational amplifier 4, but an open drain type may also be applicable.

Figure 3:
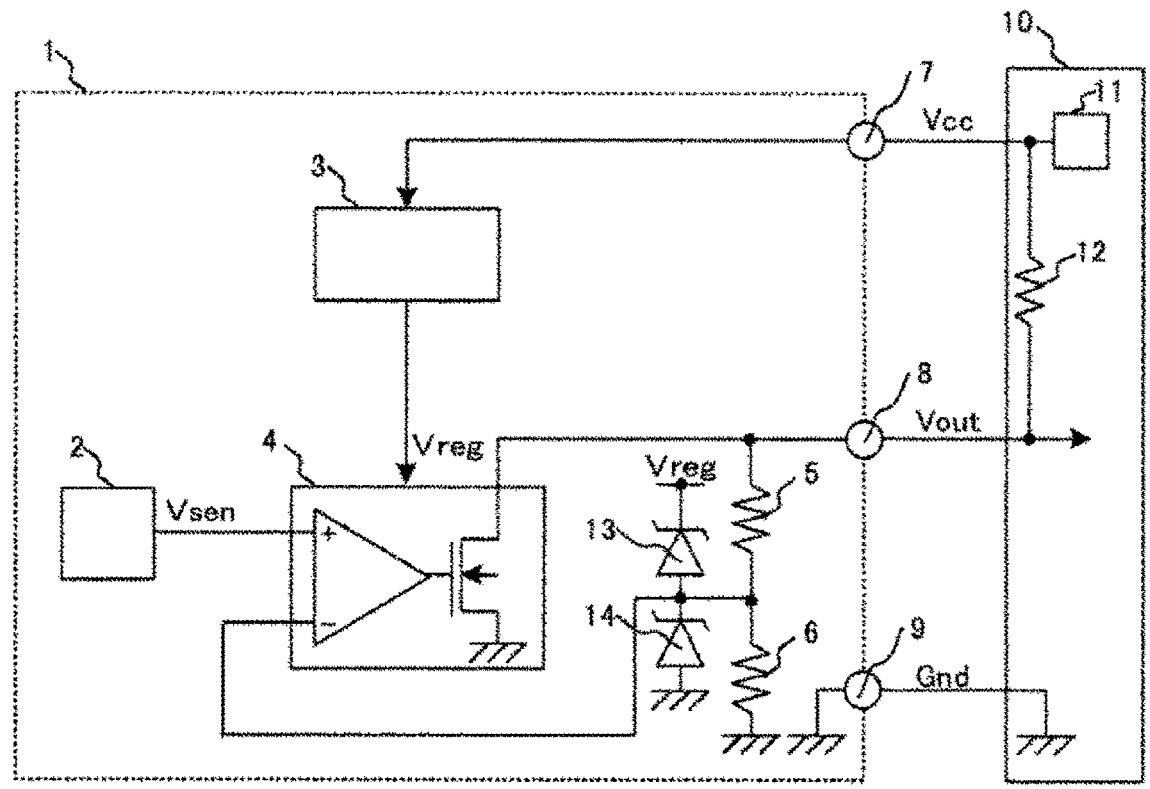
FIG. 3 is a diagram illustrating a circuit configuration of a sensor device according to a second practical example.

Next, a sensor device according to a second practical example of the present invention will be described with reference to FIG. 3. FIG. 3 illustrates a circuit configuration of the sensor device of the second practical example.

The sensor device of the second practical example has a configuration basically same as that of the sensor device of the first practical example, but following improvements are added. In the present practical example, protection performance for the input circuit of the operational amplifier 4 is improved by adding Zener diodes 13 and 14. The input circuit of the operational amplifier 4 is protected by the resistance elements 5 and 6 as described in the first practical example, but the noise immunity is further improved by adding the Zener diodes 13 and 14. Meanwhile, current flowing when noise is applied to the Zener diodes 13 and 14 is limited by the resistance elements 5 and 6, and therefore, size reduction can be achieved.

Figure 4:
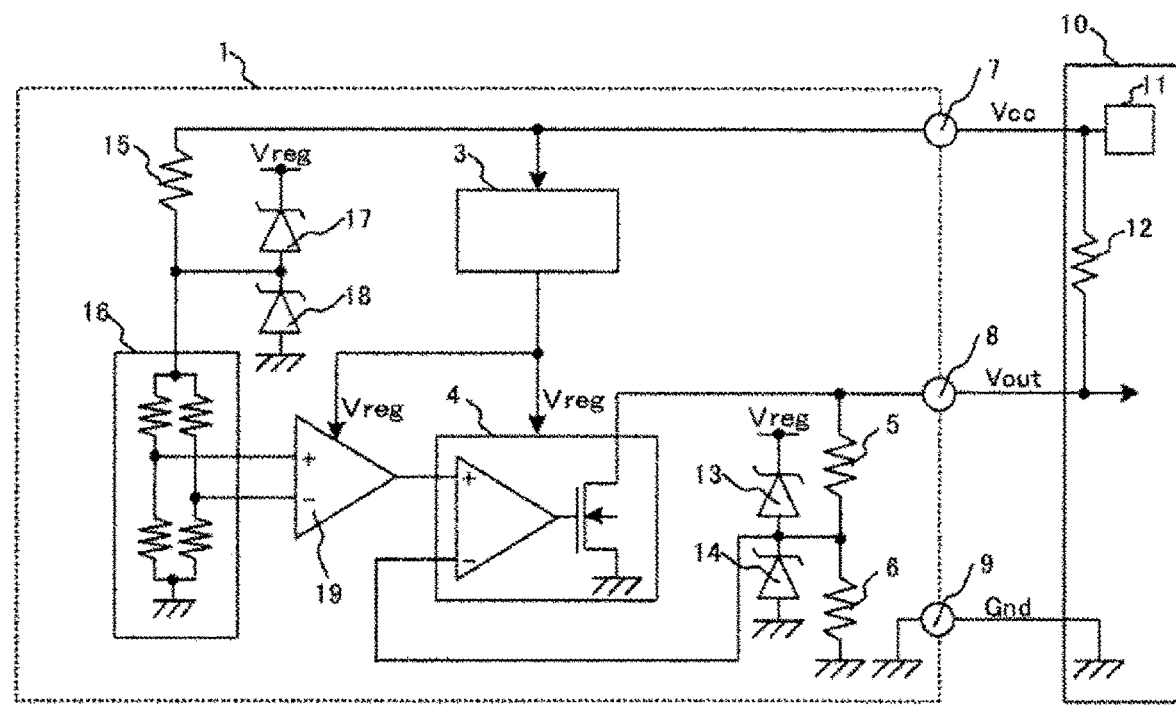
FIG. 4 is a diagram illustrating a circuit configuration of a sensor device according to a third practical example.

Next, a sensor device according to a third practical example of the present invention will be described with reference to FIG. 4. FIG. 4 illustrates a circuit configuration of the sensor device of the third practical example.

The sensor device of the third practical example has a configuration basically same as that of the sensor device of the first practical example, but following improvements are added. In the present practical example, added are: a resistance type physical quantity detection element 16, a resistance element 15 connecting the power source terminal 7 to the physical quantity detection element 16; Zener diodes 17 and 18 connected to one end of the resistance element 15 and protecting the physical quantity detection element 16 from power source noise; and an amplifier 19 to amplify output voltage of the physical quantity detection element 16. Note that power for the amplifier 19 is supplied from the output voltage Vreg of a regulator 3. Additionally, a bridge circuit is formed with resistance elements in the resistance type physical quantity detection element 16, and an output voltage of the bridge circuit is changed when a resistance value is changed in accordance with a measured physical quantity.

Next, operation of the sensor device of the third practical example will be described. In the present practical example, power for the resistance type physical quantity detection element 16 is connected from the power source terminal 7 via the resistance element 15. Therefore, a voltage of the physical quantity detection element 16 is lowered by connecting the resistance element 15 and made to fall within an input range of the amplifier 19 that is operated with a low-voltage power of the regulator 3. Additionally, output of the physical quantity detection element 16 is proportional to the voltage Vcc of the power source terminal 7. Furthermore, the output of the physical quantity detection element 16 is output to the sensor output terminal 8 via the amplifier 19 and the operational amplifier 4. Therefore, the output voltage of the sensor output terminal 8 has a ratiometric characteristic proportional to the voltage Vcc of the power source terminal 7. The ratiometric characteristic is the characteristic often used in an automotive sensor and the like. In other words, in the sensor device 1 of the present practical example, the power voltage of the internal signal processing circuit (amplifier 19 and operational amplifier 4) can be lowered, and the ratiometric characteristic can be obtained.

Next, effects of the present practical example will be described. First of all, a first effect is that the power voltage of the internal signal processing circuit (amplifier 19 and operational amplification 4) can be lowered. As a result, the signal processing circuit (amplifier 19 and operational amplification 4) can be manufactured by the microfabrication process and can be miniaturized into a chip size. Additionally, since the high performance MOS transistor can be used by application of the microfabrication process, performance of the signal processing circuit (amplifier 19 and operational amplification 4) can be further improved. Furthermore, since the signal processing circuit (amplifier 19 and operational amplification 4) can be manufactured by the microfabrication process, it is possible to arrange a large-scale logic circuit on a chip same as the signal processing circuit (amplifier 19 and operational amplification 4), and the sensor device 1 can have complicated functions. Next, a second effect is that an input circuit of the amplifier 19 having degraded noise immunity due to application of the microfabrication process can be easily protected. The power source terminal 7 is connected to the control device 10 via the power source line Vcc, but external noise is applied to the output line Vcc due to the facts that the output line Vcc is laid over a long distance and a noise source exists around the output line Vcc, and a noise voltage is generated at the power source terminal 7 and the sensor device 1 may be destroyed. However, in the present sensor device 1, there are effects in that: the noise voltage is reduced by voltage division performed by a voltage divider formed of the resistance element 15 and the physical quantity detecting element 16; noise current is reduced by resistance itself of the resistance element 15; and also the noise voltage is reduced by a time constant generated by resistance of the resistance element 15 and a parasitic capacitance existing in the resistance element 15. With the effects, the input circuit of the amplifier 19 having the degraded noise immunity due to application of the microfabrication process can be easily protected. Meanwhile, a resistance value of the resistance element 15 is preferably high, more preferably, 10 kΩ or more. Additionally, the noise immunity is further improved by adding the Zener diodes 17 and 18. Next, a third effect is that a ratiometric characteristic can be obtained. Since the ratiometric characteristic can simplify an AD conversion circuit of the control device 10, this characteristic is often used in an automotive sensor.

Figure 5:
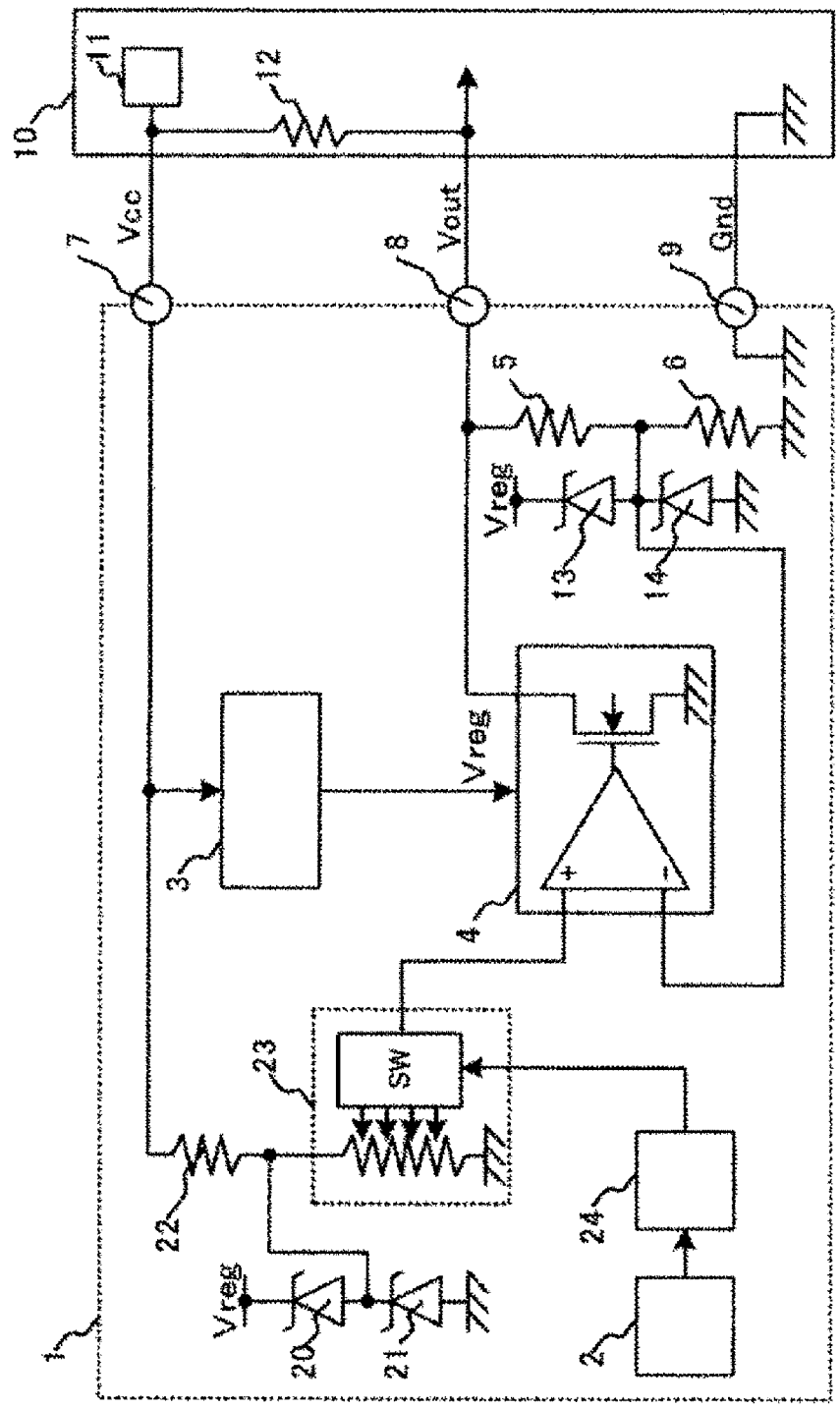
FIG. 5 is a diagram illustrating a circuit configuration of a sensor device according to a fourth practical example.
Figure 6:
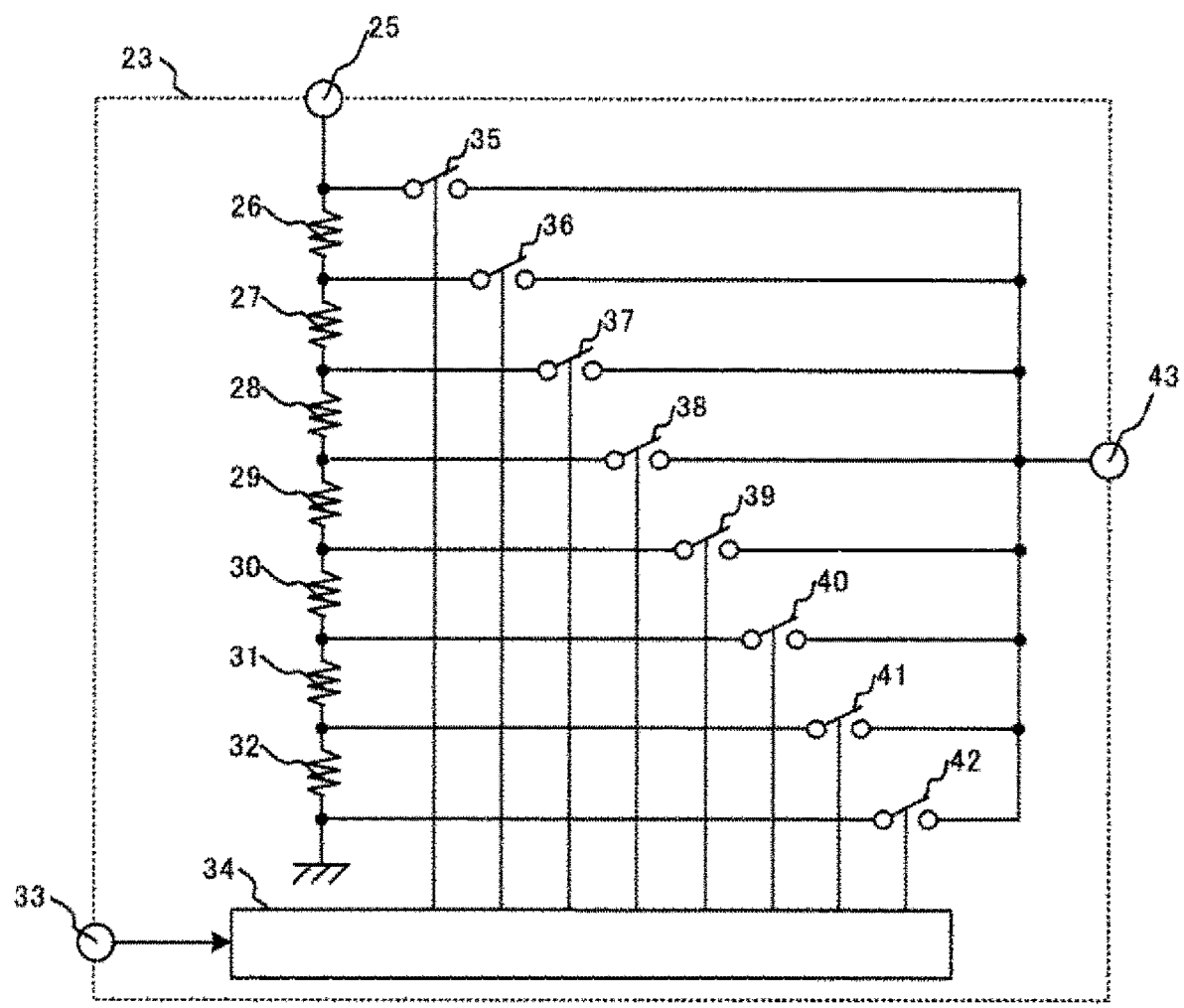
FIG. 6 is a circuit configuration of a DA converter 23.

Next, a sensor device according to a fourth practical example of the present invention will be described with reference to FIGS. 5 and 6. FIG. 5 illustrates a circuit configuration of the sensor device of the fourth practical example, and FIG. 6 illustrates a circuit configuration of a DA converter 23.

The sensor device of the fourth practical example has a configuration basically same as that of the sensor device of the first practical example, but following improvements are added. In the present practical example, a signal from the physical quantity detection unit 2 is digitally processed by an arithmetic unit 24, the digital signal is converted into an analog signal by the resistance type DA converter 23, and a voltage of the sensor output terminal 8 is generated via an operational amplification 4. Here, Zener diodes 20 and 21 to protect a resistance element 22 and the DA converter 23 from power source noise are added between the resistance type DA converter 23 and the power source terminal 7. Note that power for the DA converter 23 is supplied from the output voltage Vreg of the regulator 3.

Next, the configuration of the resistance type DA converter 23 will be described on the basis of FIG. 6. The DA converter 23 includes: a reference power source terminal 25; resistors 26, 27, 28, 29, 30, 31, and 32 connected between the reference power source terminal 25 and the ground; a digital input terminal 33 to receive a digital value from the arithmetic unit 24; a decoder 34 to decode a signal from the digital input terminal 33; and switches 35, 36, 37, 38, 39, 40, 41, and 42 controlled to be turned on/off by a signal from the decoder 34 and functioning to select respective connection points of the resistors 26, 27, 28, 29, 30, 31, and 32.

Next, operation of the sensor device of the third practical example will be described. In the present practical example, more accurate correction can be performed by digitally processing the signal from the physical quantity detection unit 2 by the arithmetic unit 24. As a result, a temperature characteristic, non-linearity, and the like are improved, and measurement accuracy of the sensor device 1 is improved. Additionally, the DA converter 23 is made to have a ratiometric characteristic by connecting the DA converter 23 to the power source terminal 7 via the resistance element 22. Furthermore, a voltage applied to the DA converter 23 is lowered by connecting the resistance element 22 to the DA converter 23 such that operation can be performed with the low-voltage power of the regulator 3 and also the voltage is made to fall within an input range of the operational amplifier 4 operated with the low-voltage power of the regulator 3.

Next, effects of the present practical example will be described. First of all, a first effect is that the power voltage of the internal signal processing circuit (arithmetic unit 24, DA converter 23, and operational amplification 4) can be lowered. As a result, the signal processing circuit can be manufactured by the microfabrication process and can be miniaturized into a chip size. Additionally, since the high performance MOS transistor can be used by application of microfabrication process, performance of the signal processing circuit can be further improved. Next, a second effect is that the DA converter 23 having degraded noise immunity due to application of the microfabrication process can be easily protected. As described above, external noise is applied to the power source terminal 7 and may destroy the sensor device 1. However, in the present sensor device 1, there are effects in that: the noise voltage is reduced by voltage division performed by a voltage divider formed of the resistance element 22 and the DA converter 23; noise current is reduced by resistance itself of the resistance element 22; and also the noise voltage is reduced by a time constant generated by resistance of the resistance element 22 and a parasitic capacitance existing in the resistance element 22. With the effects, the DA converter 23 having the degraded noise immunity due to application of the microfabrication process can be easily protected. Additionally, the noise immunity is further improved by adding the Zener diodes 20 and 21. Next, a third effect is that a ratiometric characteristic can be obtained.

Figure 7:
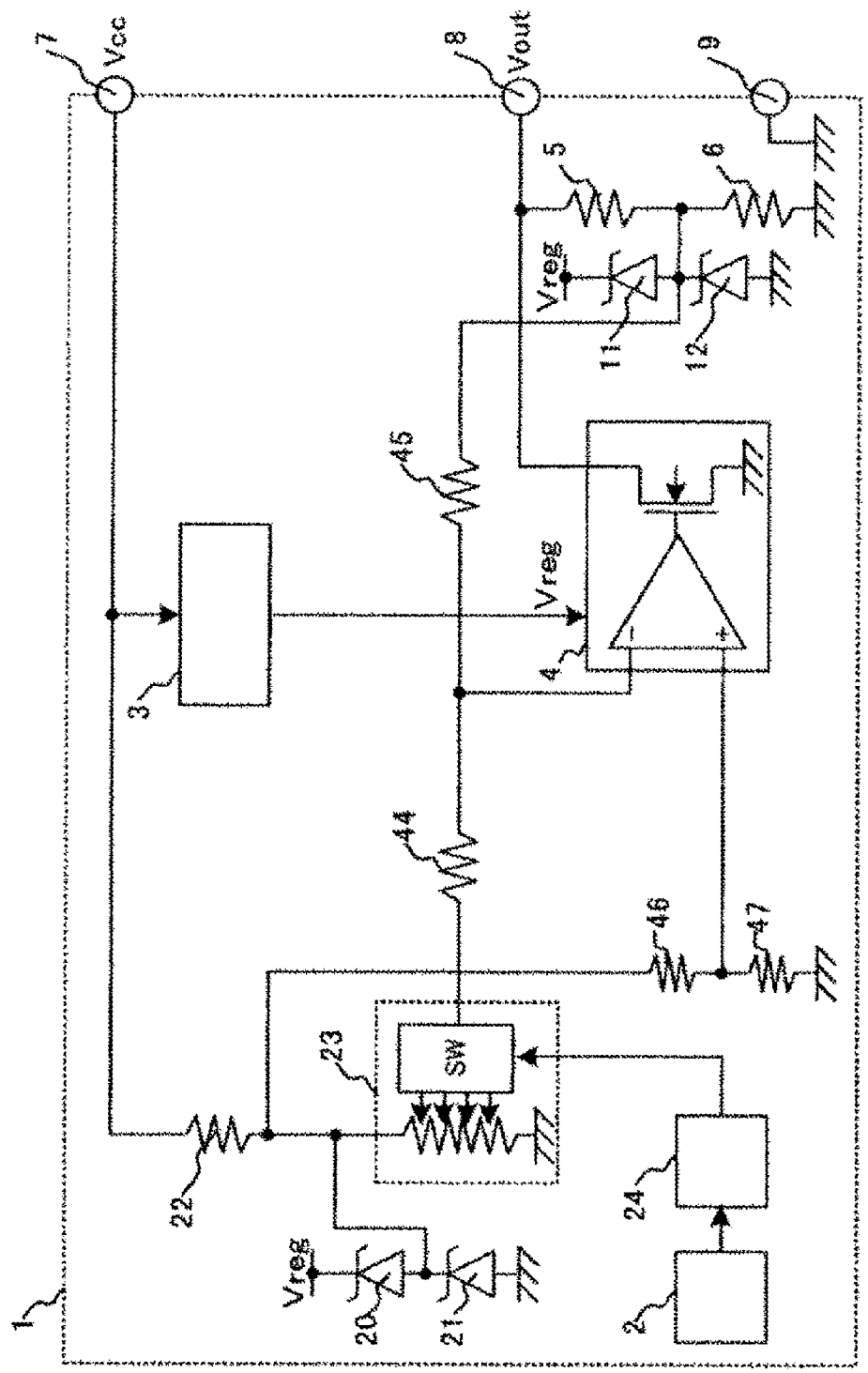
FIG. 7 is a diagram illustrating a circuit configuration of a sensor device according to a fifth practical example.

Next, a sensor device according to a fifth practical example of the present invention will be described with reference to FIG. 7. FIG. 7 illustrates a circuit configuration of the sensor device of the fifth practical example.

The sensor device of the fifth practical example has a configuration basically same as that of the sensor device of the fourth practical example, but following improvements are added. In the present practical example, the operational amplifier 4 is used as inverting amplification. Therefore, a resistor 44 is disposed between an output of the DA converter 23 and the operational amplifier 4, a resistor 45 is disposed between an inversion input of the operational amplification 4 and a connection point for the resistance elements 5 and 6, resistance elements 46 and 47 are disposed between the ground and a connection point for the resistance element 22 and the DA converter 23, and a connection point for the resistance elements 46 and 47 is connected to a non-inversion input of the operational amplifier 4.

In the present practical example, the operational amplification 4 is used as an inverting amplifier. Therefore, voltage change at the inversion input and the non-inversion input of the operational amplifier 4 can be reduced. The lower the power voltage is, the narrower the in-phase input range of the operational amplifier 4 becomes. Therefore, in order to further lower the power voltage of the operational amplifier 4, it is more excellent to use the operational amplifier 4 as the inverting amplifier that is operated even in a case where the in-phase input range is narrow. In other words, in the present practical example, the power voltage of the operational amplifier 4 can be further lowered by using the operational amplifier 4 as the inverting amplifier, and further microfabrication process can be achieved.

Figure 8:
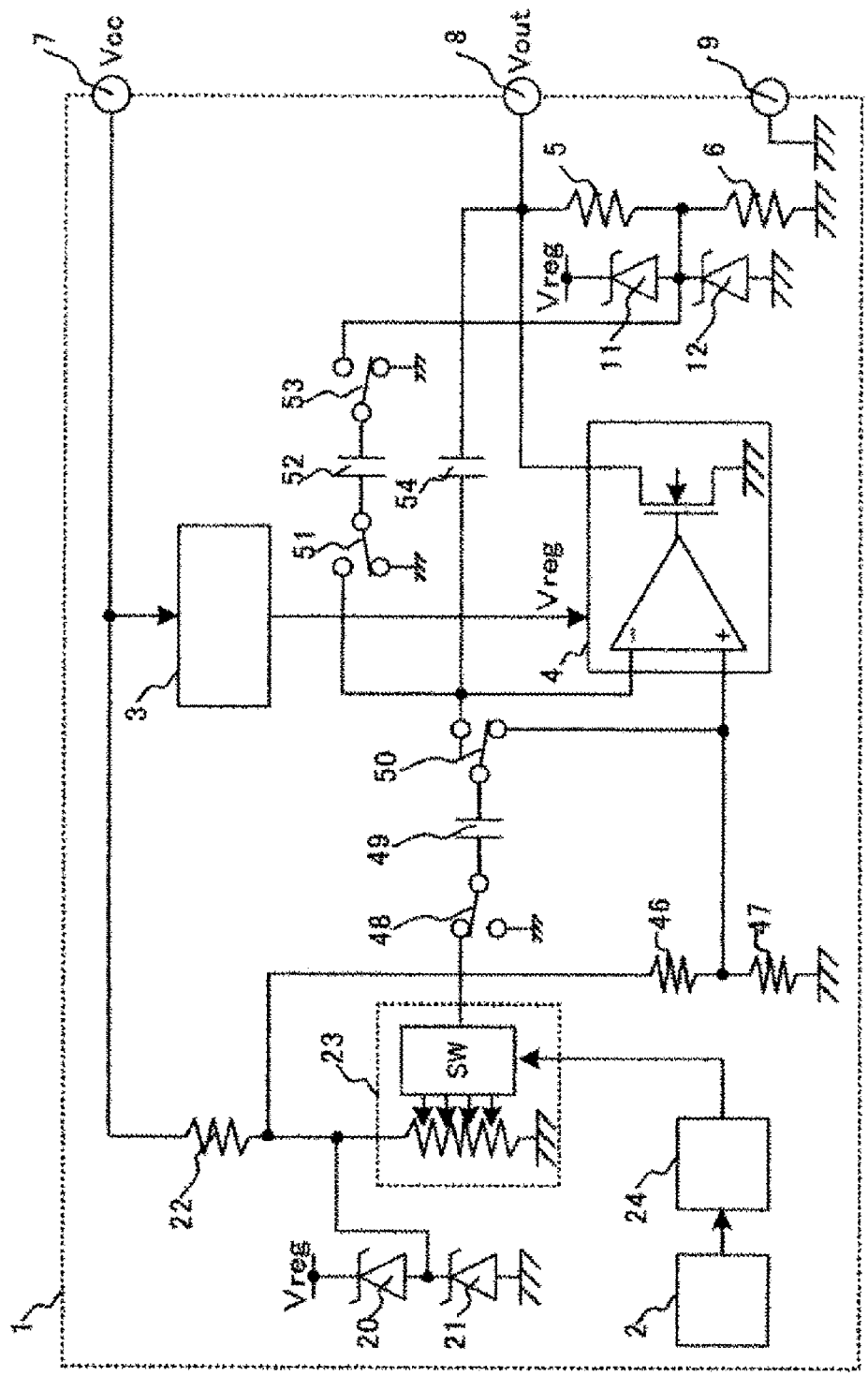
FIG. 8 is a diagram illustrating a circuit configuration of a sensor device according to a sixth practical example.

Next, a sensor device according to a sixth practical example of the present invention will be described with reference to FIG. 8. Note that FIG. 8 illustrates a circuit configuration of the sensor device of the sixth practical example.

The sensor device of the sixth practical example has a configuration basically same as that of the sensor device of the fifth practical example, but following improvements are added. In the present practical example, resistance elements 44 and 45 are utilized in using the operational amplifier 4 as the inverting amplifier, but in the present practical example, a switched capacitor circuit is formed. Therefore, switches 48 and 50 and a capacitor 49 are disposed instead of the resistor 44, switches 51 and 53 and a capacitor 52 are disposed instead of the resistor 45, and a capacitor 54 is disposed between the inversion input of the operational amplification 4 and the sensor output terminal 8 in order to stabilize a system. In the fifth practical example, non-linearity is generated in a characteristic of the sensor output terminal 8 by mutual influence between the resistance elements 5, 6, and 45. In order to reduce such non-linear, the resistor 45 is needed to be formed large enough for the resistors 5 and 6, but a resistance ratio inside an integrated circuit is limited. To solve such a problem, the switched capacitor circuit is used in the present practical example instead of the resistance elements. The switched capacitor circuit can easily form a high equivalent resistance. Therefore, in the present practical example, the non-linearity of the sensor output terminal 8 can be remarkably reduced.

REFERENCE SIGNS LIST

1 Sensor device
2 Physical quantity detection unit
3 Regulator
4 Operational amplifier
5 Resistance element
6 Resistance element
7 Power source terminal
8 Sensor output terminal
9 Ground terminal
10 Control device
11 Constant voltage source
12 Pull-up resistor
13 Zener diode
14 Zener diode
15 Resistance element
16 Physical quantity detecting element
17 Zener diode
18 Zener diode
19 Amplifier
20 Zener diode
21 Zener diode
22 Resistance element
23 DA converter
24 Arithmetic unit
25 Reference power source terminal
26 Resistor
27 Resistor
28 Resistor
29 Resistor
30 Resistor
31 Resistor
32 Resistor
33 Digital input terminal
34 Decoder
35 Switch
36 Switch
37 Switch
38 Switch
39 Switch
40 Switch
41 Switch
42 Switch
43 Output terminal
44 Resistance element
45 Resistance element
46 Resistance element
47 Resistance element
48 Switch
49 Capacitor
50 Switch
51 Switch
52 Capacitor
53 Switch
54 Capacitor

The invention claimed is:
1. A sensor device connected to an in-vehicle device and driven by a voltage supplied from the in-vehicle device, comprising:
a physical quantity detector configured to output a detection signal;

an output terminal;

an operational amplifier configured to receive the detection signal from the physical quantity detector and output an output signal that selectively controls a voltage of the output terminal to change from a voltage of a ground to a voltage equal to the voltage supplied from the in-vehicle device;

a regulator configured to receive the voltage supplied from the in-vehicle device and generate an output voltage which is lower than the voltage supplied from the in-vehicle device, wherein the output voltage is supplied to the operational amplifier, and a negative feedback circuit configured to receive a signal having the voltage of the output terminal and to output, to the operational amplifier, a feedback signal having a voltage lower than the voltage of the output terminal, wherein the physical quantity detector comprises at least one of a pressure sensor, an acceleration sensor, an angular velocity sensor, and an air flow rate sensor.

2. A sensor device comprising:

a transistor configured to control a current flow from an output terminal of the sensor device to a ground having a ground voltage;

an operational amplifier configured to output an output signal that controls the transistor;

a regulator configured to receive a supplied voltage and output a voltage lower than the supplied voltage to the operational amplifier; and a resistance circuit comprising a plurality of resistors and configured to receive a signal having a voltage equal to a voltage of the output terminal and output a voltage lower than the voltage of the output terminal, wherein the operational amplifier is configured to receive the voltage output from the resistance circuit as a negative feedback signal, and the operational amplifier is configured to control the transistor to change the voltage of the output terminal from the ground voltage to the supplied voltage.

3. The sensor device according to claim 2, further comprising a protection diode connected between the resistance circuit and the operational amplifier.

4. The sensor device according to claim 1, wherein
the physical quantity detector is a resistance type detection element.

5. The sensor device according to claim 1, further comprising:

a resistance type digital to analog (DA) converter electrically connected to the physical quantity detector and configured to convert a digital signal based on a signal detected by the physical quantity detector into an analog signal; and a resistance element configured to connect the DA converter to a power source terminal.

6. The sensor device according to claim 5, further comprising a protection diode connected between the DA converter and the resistance element.

7. The sensor device according to claim 1, wherein the operational amplifier is an inverting type amplifier circuit.

8. The sensor device according to claim 7, wherein the operational amplifier comprises a switched capacitor circuit.

9. The sensor device according to claim 1, wherein the physical quantity detector is configured to output the detection signal at the voltage supplied to the operational amplifier.

10. The sensor device according to claim 1, wherein an in-phase input range of the operational amplifier has a maximum value lower than the voltage supplied to the operational amplifier.

11. The sensor device according to claim 1, further comprising a transistor having a gate connected to the output signal of the operational amplifier, the transistor configured to control current flow from the output terminal to the ground.

12. The sensor device of claim 11, wherein the negative feedback circuit comprises a voltage divider.

* * * * *